(12) United States Patent
Lasser et al.

(10) Patent No.: US 10,673,400 B2
(45) Date of Patent: Jun. 2, 2020

(54) GAIN STABILIZATION FOR SUPPLY MODULATED RF AND MICROWAVE INTEGRATED CIRCUITS

(71) Applicant: The Regents of the University of Colorado, a body corporate, Denver, CO (US)

(72) Inventors: Gregor Lasser, Boulder, CO (US); Zorana Popovic, Boulder, CO (US)

(73) Assignee: The Regents of the University of Colorado, a body, Denver, CO (US)

( * ) Notice: Subject to any disclaimer, the term of this patent is extended or adjusted under 35 U.S.C. 154(b) by 27 days.

(21) Appl. No.: 16/191,053

(22) Filed: Nov. 14, 2018

(65) Prior Publication Data
US 2019/0348959 A1   Nov. 14, 2019

Related U.S. Application Data

(60) Provisional application No. 62/585,865, filed on Nov. 14, 2017.

(51) Int. Cl.
| | |
|---|---|
| *H03G 3/30* | (2006.01) |
| *H03F 1/02* | (2006.01) |
| *H03F 3/21* | (2006.01) |
| *H03F 3/193* | (2006.01) |

(52) U.S. Cl.
CPC ............. *H03G 3/30* (2013.01); *H03F 1/0205* (2013.01); *H03F 3/193* (2013.01); *H03F 3/21* (2013.01)

(58) Field of Classification Search
CPC ................................. H03G 3/30; H03F 1/0205
See application file for complete search history.

(56) References Cited

U.S. PATENT DOCUMENTS

| | | | | |
|---|---|---|---|---|
| 6,201,375 | B1* | 3/2001 | Larson | G05F 1/573 |
| | | | | 323/277 |
| 7,333,778 | B2* | 2/2008 | Pehlke | H03C 1/06 |
| | | | | 330/10 |
| 8,780,948 | B2 | 7/2014 | Wilkenson et al. | |
| 9,793,808 | B1* | 10/2017 | Yasuhara | H02M 3/158 |
| 2005/0068107 | A1 | 3/2005 | Bachhuber et al. | |
| 2010/0194462 | A1* | 8/2010 | Petruzzi | H03K 17/0822 |
| | | | | 327/427 |
| 2012/0313701 | A1* | 12/2012 | Khlat | H02M 3/07 |
| | | | | 330/127 |
| 2012/0326783 | A1* | 12/2012 | Mathe | H03F 1/0227 |
| | | | | 330/251 |
| 2017/0220058 | A1* | 8/2017 | Petenyi | G05F 1/575 |
| 2017/0328934 | A1* | 11/2017 | Mayell | G01R 19/0092 |

* cited by examiner

*Primary Examiner* — Patricia T Nguyen
(74) *Attorney, Agent, or Firm* — Macheledt Bales LLP; Jennifer L. Bales

(57) ABSTRACT

Biasing circuitry for RF and microwave integrated circuits keeps the quiescent current of a power amplifier integrated circuit constant when operated with a time-varying DC supply voltage. A dynamic gate bias circuit includes an on-chip sense transistor and control circuitry to keep current of the sense transistor substantially constant by varying sense transistor bias voltage to compensate for variation in the time-varying supply voltage signal. The varying bias voltage is then applied to the amplifying transistors of the power amplifier, resulting in their quiescent current being substantially independent of the time-varying supply voltage.

17 Claims, 8 Drawing Sheets

GAIN STABILIZATION FOR SUPPLY MODULATED RF AND MICROWAVE INTEGRATED CIRCUITS

BACKGROUND OF THE INVENTION

Field of the Invention

The present invention relates to gain stabilization for supply modulated RF circuits. In particular, the present invention relates to dynamic biasing circuitry for RF and microwave circuits that keeps the quiescent current substantially constant given a varying DC supply voltage.

Discussion of Related Art

Radio frequency (RF) power amplifiers (PAs) are devices that take a small RF signal at the input and provide an upscaled (amplified) version of this input signal at the output (note that the term "RF" includes microwave frequencies herein). PAs are used in various circuitry that employs a transmitter, examples being cell phones, radar transmitters, remote controlled toys, WiFi access points, RFID readers or handheld radios. PAs require a direct current (DC) supply to operate. The efficiency of a power amplifier is defined as the ratio of RF output power to DC input power. To obtain efficient operation for signals with varying amplitudes a technique called envelope tracking (ET) or supply modulation can be used. This technique alters the supply voltage of the PA in accordance with the input amplitude, which achieves efficient operation assuming that the PA does not alter its characteristics when supplied with a variable DC supply.

A block diagram for such a supply modulated PA 100 is shown in FIG. 1 (Prior Art). Here a two-stage 120, 122 PA is drawn. The PA is supplied with a time varying supply voltage $V_D(t)$ 102, provided by a supply modulator 104. The control signal 106 for the supply modulator 104 is derived from the amplitude of the input signal $RF_{IN}$ 108 in a separate block, the drive signal generator 110, either in an analog or digital fashion. The bias of the PA is adjusted during manufacturing and then supplied by a fixed DC gate supply 112, providing fixed gate bias voltages $V_{G1}$ 114 and $V_{G2}$ 116.

A more detailed (although still simplified for clarity) schematic of the RF PA of FIG. 1 is shown in FIG. 2 (Prior Art). In this example, the first stage 120 consists of a single RF transistor $T_{RF1}$ 202 and the input and output bias-Ts 210 constructed from inductors and capacitors. The inductors allow for the gate and drain biases to pass to the transistor, but block the RF signal. The capacitors, on the other hand, let the RF signal pass but block the DC biasing signals. In this example, the second stage 122 is constructed of two RF transistors $T_{RF2}$ 204 and $T_{RF3}$ 206, which share the same bias-T 220. The second stage 122 therefore only has a single gate bias and a single drain supply connection, although it uses more than one transistor inside. FIG. 2 omits RF matching circuitry for clarity. The focus here is on the DC biasing of the RF transistors.

The active devices in PAs can be made from different technologies, where SiGe, CMOS, InP, GaAs or GaN are a few examples. Often these amplifiers are manufactured as an RF integrated circuit (RFIC) or MMIC (monolithic microwave integrated circuit). One drawback of some amplifier technologies—for example GaN is that the quiescent current changes significantly for varying drain voltages. Since the quiescent current is related to the gain of the amplification, this leads to a supply voltage dependent gain, when the gate bias voltage is kept constant—as is conventionally done, as is shown in FIG. 1.

The small-signal gain of a 2-stage GaN MMIC PA is shown in FIG. 3 for different drain voltages. The measured gain for the conventional constant gate voltage case varies from 12 to 27 dB, independent of the operating frequency. But when the gate voltages of this MMIC are dynamically adjusted to keep the quiescent current in the transistors constant, the gain variation is reduced to a swing between 23 to 27 dB, again with almost no frequency dependency. However, if done externally this adjustment requires extra hardware, sensors, and accurate characterization of the device including modeling of temperature and trapping effects, which is a challenging task by itself. Further, the interconnect between the RFIC or MMIC to the gate driving circuit needs to be able to handle the required signal bandwidth which is as large as the bandwidth of the drain (supply modulation) signal. There are several known circuits that keep the currents through RF transistors of an amplifier constant, but these circuits are not applicable to an efficient RF PA where the transistor currents are supposed to increase when larger RF input signals $RF_{IN}$ are present.

A need remains in the art for a dynamic biasing circuit for RF and microwave circuits that keeps the quiescent current substantially constant given a varying DC supply voltage, but purposefully allows for higher transistor currents at large RF signal conditions.

SUMMARY OF THE INVENTION

It is an object of the present invention to provide a dynamic biasing circuit for RF and microwave circuits that keeps the quiescent current substantially constant given a varying DC supply voltage.

Apparatus for stabilizing gain in a supply modulated RF circuit having an RF amplifying transistor includes a DC input for a fixed DC voltage supply to power the apparatus, an RF input for a time-varying RF input-voltage signal to be amplified, a supply input for a time-varying supply voltage signal based upon the RF input voltage signal, a sense transistor that is analogous to the amplifying transistor, the sense transistor being disposed on-chip with the amplifying transistor, control circuitry connected to the supply input and to the sense transistor and configured to keep current of the sense transistor substantially constant by varying sense transistor bias voltage to compensate for variation in the time-varying supply voltage signal, and circuitry configured to supply the resulting varying sense transistor bias voltage as bias voltage to the amplifying transistor, wherein the quiescent current of the amplifying transistor is kept substantially independent of the time-varying supply voltage.

The supply modulated RF circuit may be two-stage (or more) and is configured to supply the varying sense transistor bias voltage as bias voltage to the additional amplifying transistors. The control circuitry might comprise a current source, and amplifier, and two resistors.

In some embodiments the control circuitry is disposed on-chip with the amplifying transistor and the sense transistor. The amplifying transistor and the sense transistor comprise GaN transistors or GaAs transistors.

The time-varying supply voltage signal may have a bandwidth greater than 1 MHz. The time-varying supply voltage signal may vary between discrete voltage levels. Often, the time-varying supply voltage signal is an envelope signal of the time-varying RF input voltage signal.

In one preferred embodiment, a supply modulated 2-stage power RF amplifier includes biasing circuitry to keep the quiescent current constant in the RF amplifying transistors when operated with a varying DC drain power supply ($V_D(t)$). The biasing circuit is supplied from an external fixed auxiliary DC supply and uses the time varying drain voltage $V_D(t)$ to generate time varying gate voltages $V_{G1}$ and $V_{G2}$ which are then in turn applied to individual amplification stages of the integrated PA. The biasing circuit includes an on-chip sense transistor, a current source, and an error amplifier.

DETAILED DESCRIPTION OF THE INVENTION

Figure 1:
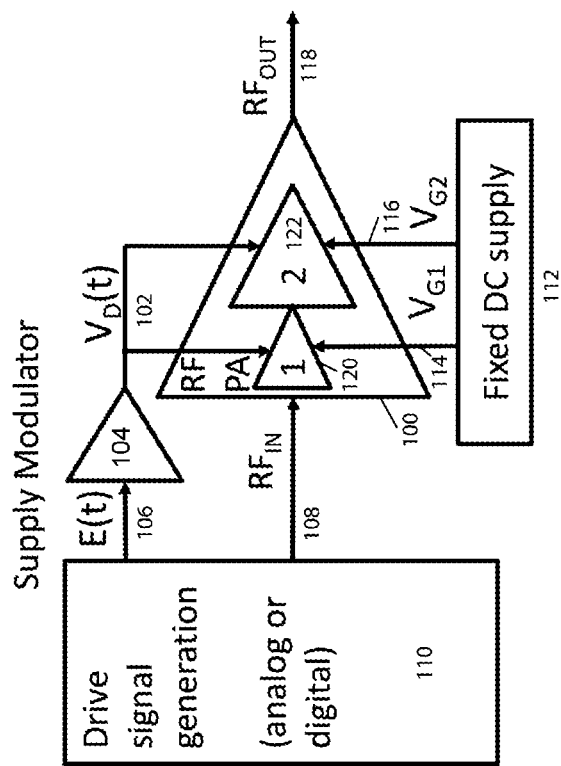
FIG. 1 (Prior Art) is a schematic block diagram of a conventional supply modulated 2-stage power amplifier FIG. 2 (Prior Art) is a more detailed schematic block diagram of the two stages of the power amplifier of FIG. 1.
Figure 4:
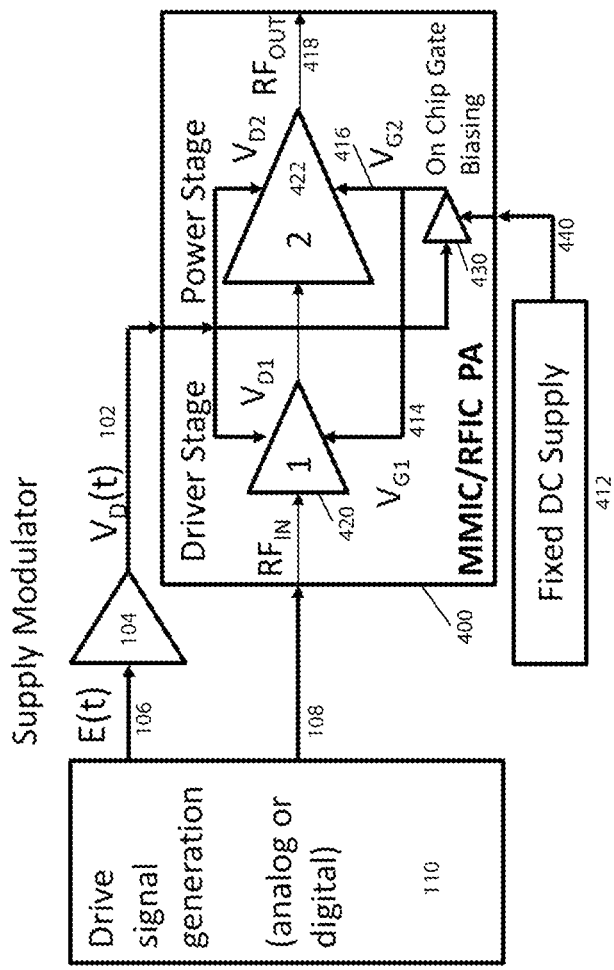
FIG. 4 is a schematic block diagram of a supply modulated 2-stage power amplifier with biasing according to the present invention.

FIG. 4 is a schematic block diagram of a supply modulated 2-stage power amplifier 400 with biasing 430 according to the present invention. The PA IC shown in FIG. 4 is similar to the conventional PA 100 of FIG. 1, with the addition of biasing circuitry 430 to keep the quiescent current constant when operated with a varying DC drain power supply ($V_D(t)$) 102. The biasing circuit is supplied with fixed DC voltage 440 from an external fixed auxiliary DC supply 412 and uses the time varying drain voltage $V_D(t)$ 102 to generate time varying gate voltages $V_{G1}$ 414 and $V_{G2}$ 416 which are then in turn applied to the individual amplification stages 420 and 422 of the integrated PA 400.

Figure 5:
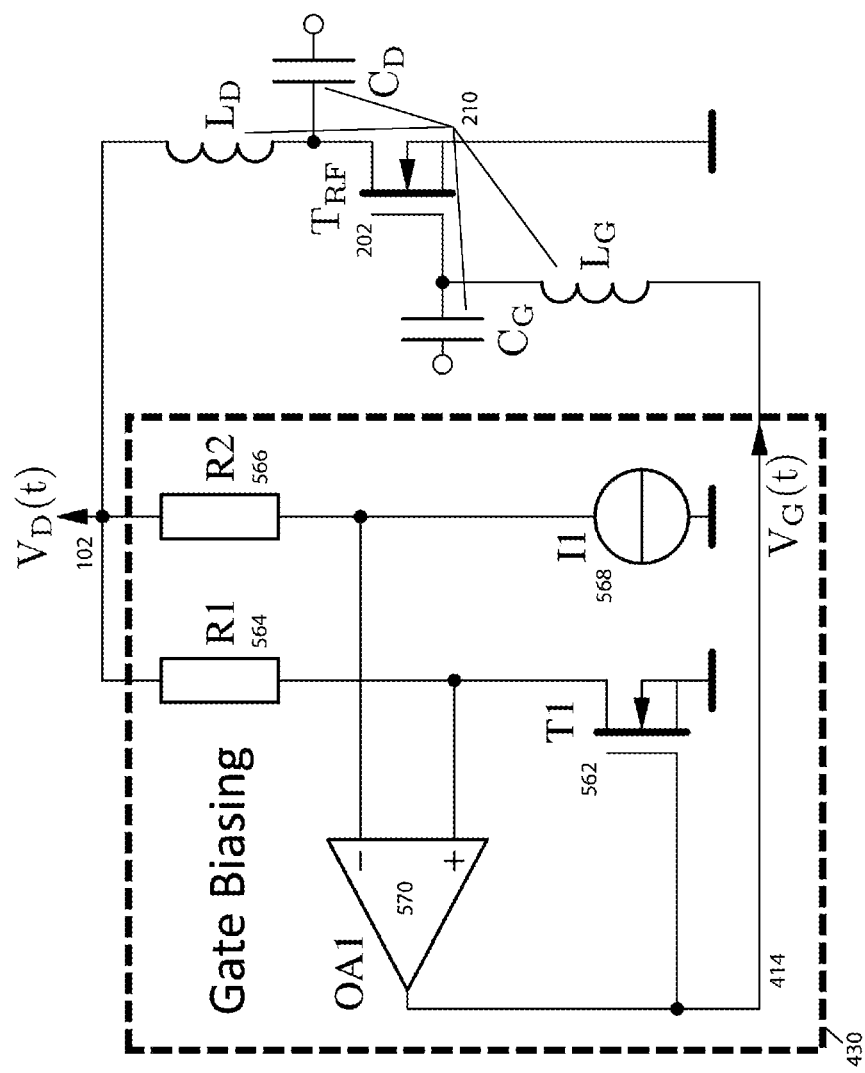
FIG. 5 is a schematic block diagram of the biasing circuitry of FIG. 4.

FIG. 5 is a schematic block diagram one embodiment of the biasing circuitry 430 of FIG. 4. The circuit takes advantage of a sense transistor T1 562, which is a scaled down version of the RF amplifying transistors 202, 204, 206. In general, sense transistor 562 is implemented on the same chip, uses the same gate length, same doping profile, and the same material stackup as the RF amplifying transistors. However, the number of fingers, and/or the gate width is often reduced so the total periphery (gate width×finger number) is smaller than the RF amplifying transistors.

Sense transistor 562 could be identical to the RF amplifying transistors, even in size, but this then results in a 1:1 mapping of the currents (from sense transistor to RF amplifying transistors), and power is wasted in the sense transistor. Thus, the sense transistor is an "analogous transistor", meaning that it is similar enough to the amplifying transistors in materials and structure that using $V_{G1}$ 414 and $V_{G2}$ 416 to bias the amplifying transistors results in, generally, a substantially constant quiescent current (i.e. largely independent of the time-varying supply voltage) in amplifying transistors 202, 204, 206, which is related to the current in sense transistor 562. Specifically, the quiescent current in the amplifying transistors is the current in sense transistor 562 scaled by the individual periphery ratios of those transistors to sense transistor 562.

Figure 2:
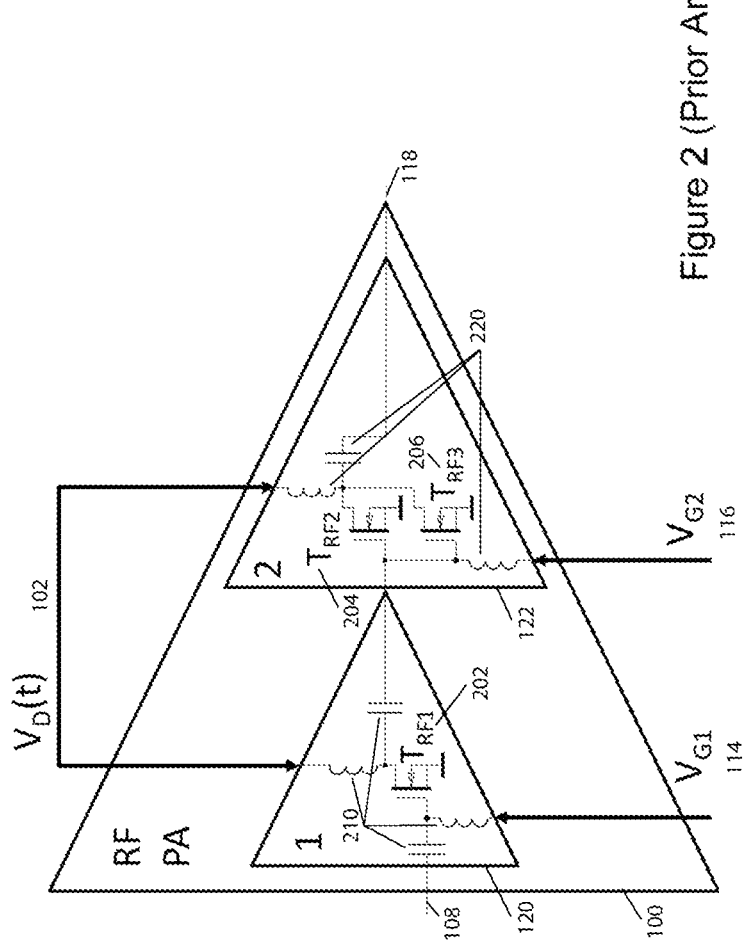

Only one exemplary RF transistor ($T_{RF1}$ 202) is drawn in FIG. 5 including its input and output bias-Ts 210 as an example for the 3 transistors 202, 204, 206 used in FIG. 2. Those skilled in the art will appreciate that this technique may be used for one-stage amplifiers, 2-stage amplifiers, or multiple stage amplifiers, the stages having varying numbers of amplifying transistors.

Further RF lines are omitted and the corresponding RF connections are indicated by the small circles connected to blocking capacitors $C_G$ and $C_D$. The sense transistor T1 562 is connected to the same supply voltage $V_D(t)$ 102 as the RF transistor $T_{RF1}$ 202 through a small sensing resistor R1 564, so the voltage on the sense transistor is almost the same as on the RF amplification transistors 202, 204, 206. The small voltage drop across R1 564 is compared to the one across R2 566 which is fed from a current source 568. The comparison takes place in an error amplifier (for example an operational amplifier) OA1 570, which controls the gate voltage 414 for T1 562 so that the voltage drops at the resistors 564, 566 are equal and the current in T1 562 corresponds to I1*R2/R1, independent of the drain voltage 102. The gates of the RF transistors 204, 206, like $T_{RF1}$ 202, are biased through the bias-T inductors ($L_G$) (not shown) with the output 414 of OA1 570 as well. This causes the quiescent drain current of each transistor $T_{RF}$ 202, 204, 206 to correspond to the current in T1 562, but linearly scaled by the fixed transistor periphery ratio of $A_{TRF}/A_{T1}$.

Figure 3:
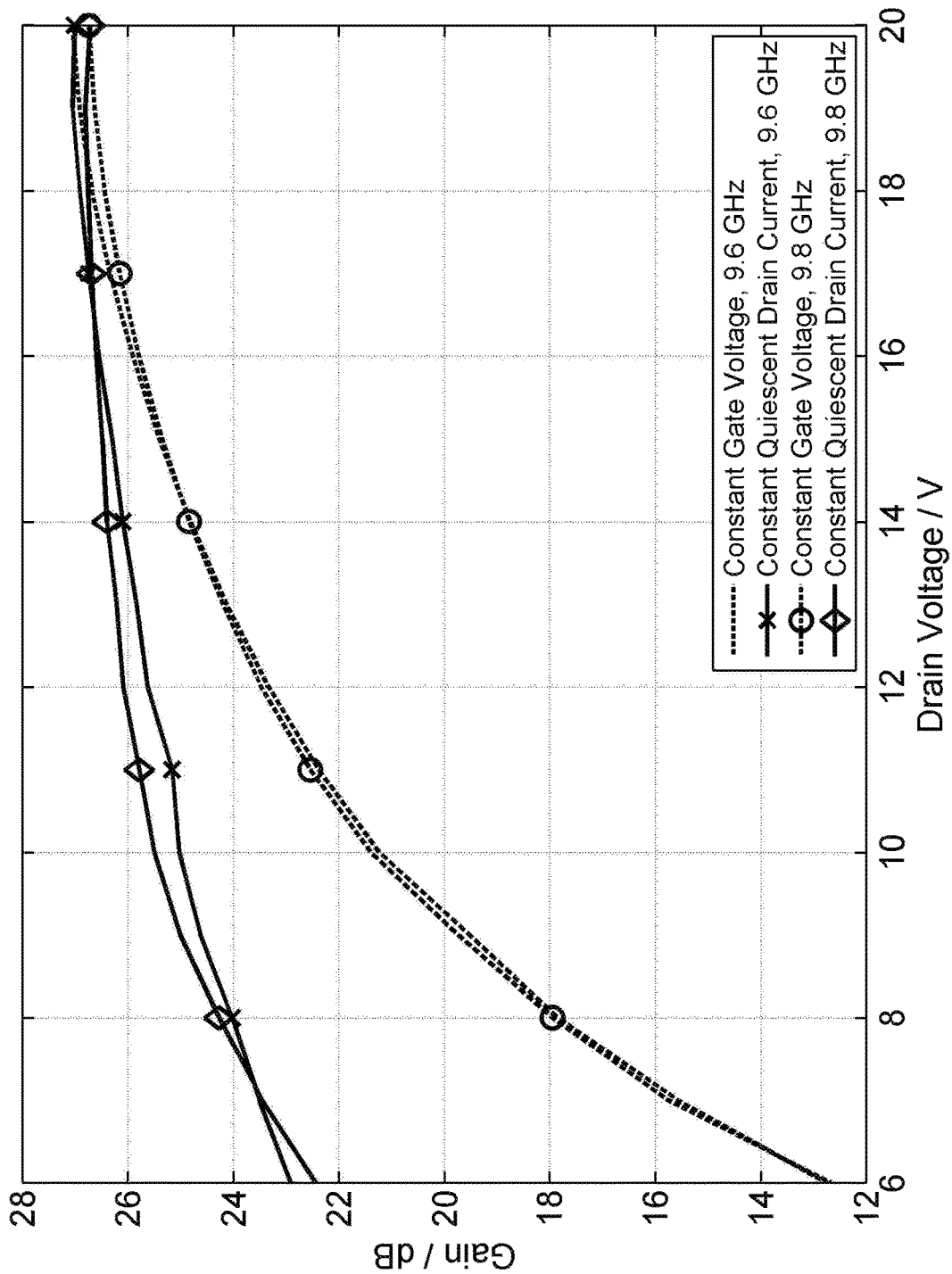
FIG. 3 is a plot showing the gain behavior of a typical GaN 2-stage integrated circuit MMIC amplifier given constant quiescent current and constant gate voltage.

Since the current in T1 562 is independent of the drain voltage 102, the quiescent current in $T_{RF1}$ 202 is also independent of the drain voltage. Therefore, an amplifier circuit 400 as in FIG. 4 using this active biasing technique follows the beneficial constant quiescent drain current behavior as shown in FIG. 3, but does not require extra gate bias drive and current sensing circuitry. Since the sense transistor 562 is on the same chip and in close proximity to the RF amplifying transistors 202, 204, 206, its behavior in terms of inherent gate threshold voltage, thermal drift, and trapping is very similar to the actual RF transistors and no characterization for external gate control is required. In some on-chip embodiments, all circuitry of the biasing network 430 can utilize the bandwidth of the process of the RF transistors 202, 204, 206, and so this dynamic gate bias works for high-bandwidth drain supply modulation signals. If lower supply modulation bandwidths are acceptable, the error amplifier (OA1) 570 and the current source (I1) 568 can be implemented fully or partially off-chip, to save chip space, but the sense transistor T1 562 preferably remains on chip. Note that this invention intentionally only keeps the quiescent currents of the RF transistors constant, i.e. the transistor currents when the RF input signal $RF_{IN}$ is small. For larger RF input signals the drain currents of the individual RF transistors will increase, and efficiently provide a larger RF output signal $RF_{OUT}$. This is possible since the biasing circuit of this invention does not sense the current in the RF transistors directly, but rather senses the current in a separate transistor (T1 in FIG. 5) that is not exposed to an RF input signal at its gate.

Figure 6:
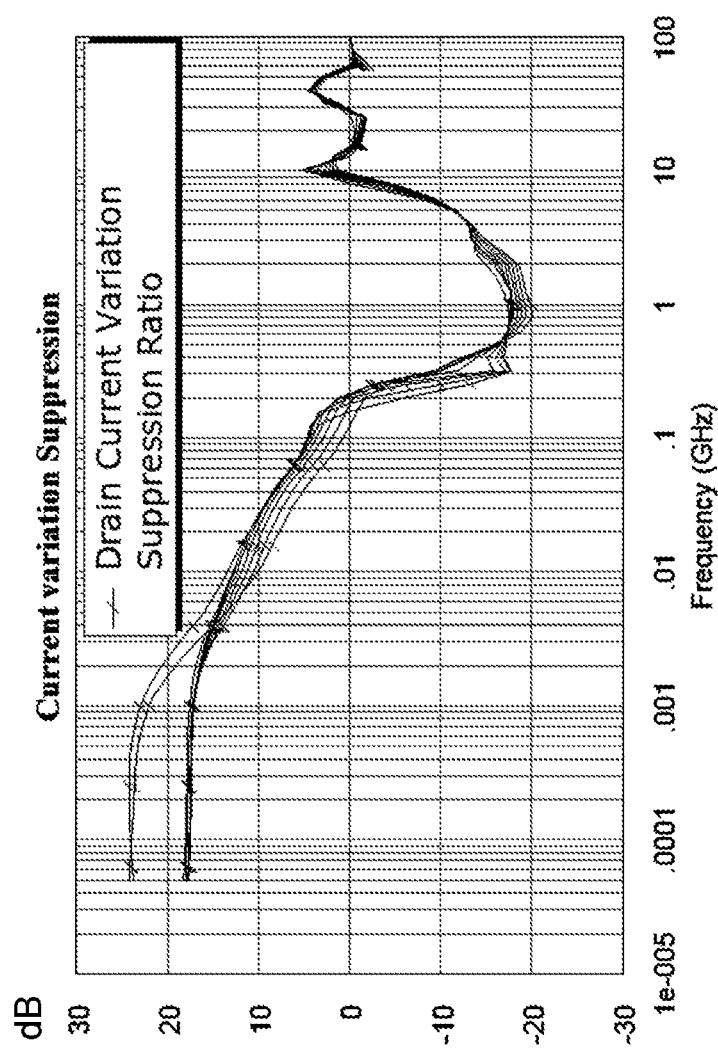
FIG. 6 is a plot showing drain current variation suppression ratio for different drain supply voltages.

FIG. 6 is a plot showing a simulation of drain current variation suppression ratio for different drain supply voltages between 6V and 22V. The active dynamic gate biasing method of FIGS. 4 and 5 was simulated in a state of the art 150 nm GaN process from Qorvo, implementing the circuitry of FIG. 5 in this process. For each DC drain voltage, an extra small signal AV drain voltage of varying frequency is added and the resulting current variation in the RF transistor $T_{RF}$ is evaluated. This is compared to the drain current variation of a separate transistor identical to $T_{RF}$ but statically biased with a fixed gate voltage. FIG. 6 plots the logarithmic ratio of these values over frequency. Low frequency variations in the drain current caused by drain voltage fluctuations are suppressed by 18 dB or more, keeping the quiescent current of the amplifying transistors substantially independent of the time-varying supply voltage. In general, the quiescent current is substantially constant, but there may be embodiments where it is desirable to change the quiescent current slightly for other reasons. For higher frequencies the suppression drops, but is positive up to 100 MHz. Therefore, for supply modulation signals up to 100 MHz the amplifier will exhibit a low gain variation.

Figure 7A:
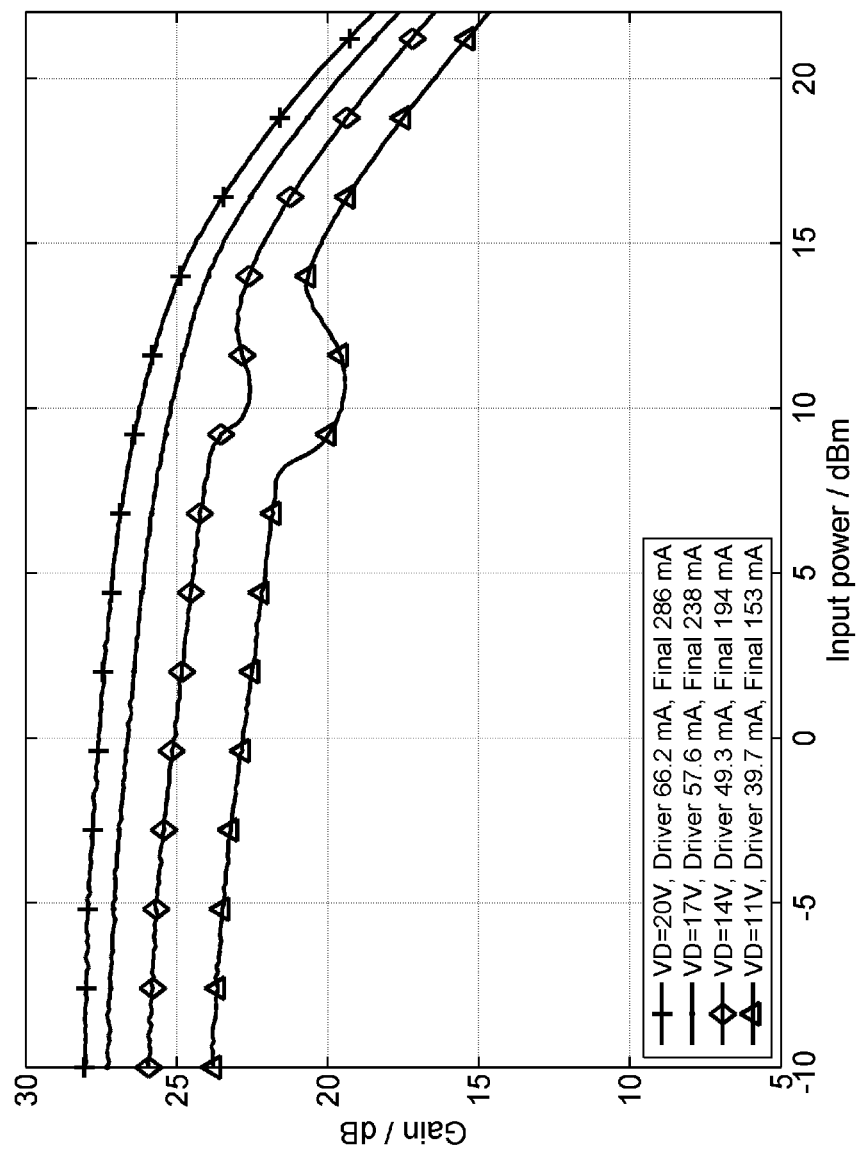
FIGS. 7A and 7B are plots illustrating the gain behavior of an example MMIC with fixed gate biasing versus constant current biasing.
Figure 7B:
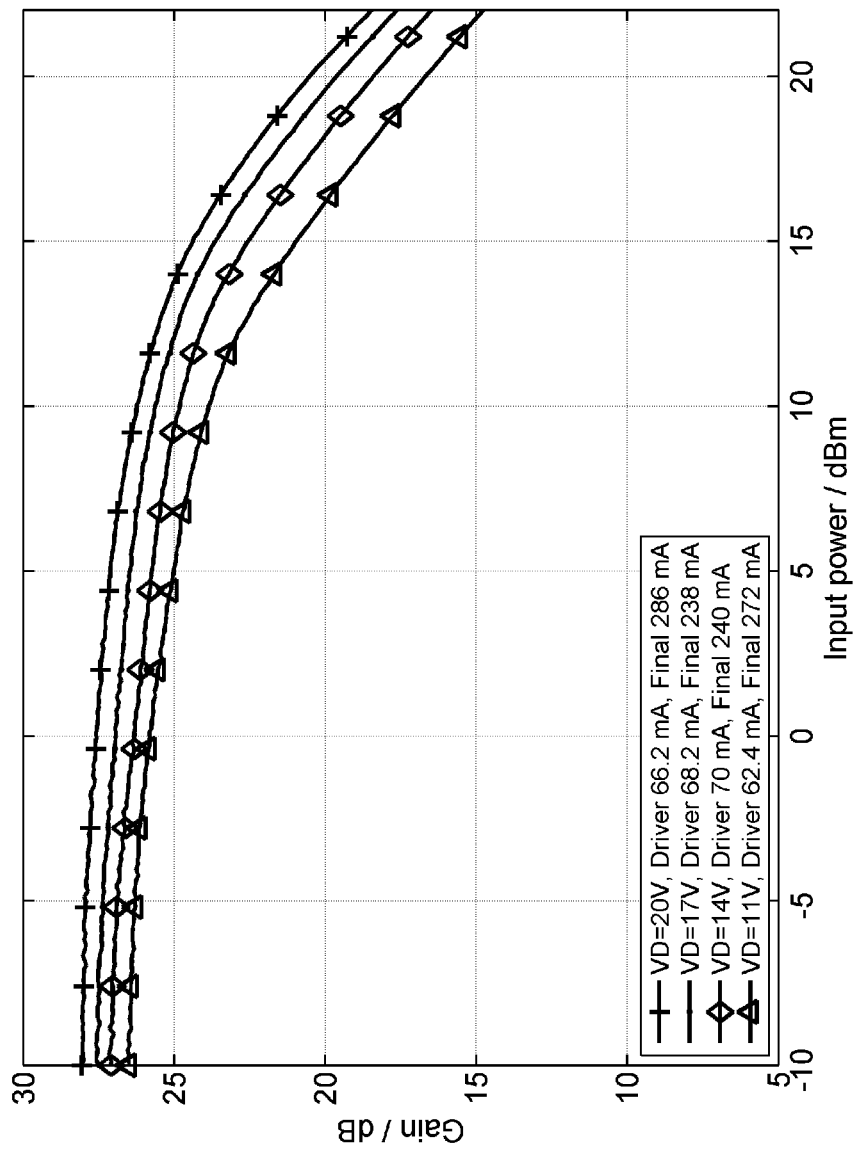

The effect on gain is also visible in FIGS. 7A and 7B: FIG. 7A shows a conventionally biased amplifier (in this case a two-stage GaN MMIC, such as that shown in FIG. 3) with a fixed gate bias for different input power levels. In addition to the gain reduction already discussed before, we also see a gain dip at 10 dBm input power, which is caused by parametric oscillations. If for the same amplifier the quiescent bias currents remain relatively constant as in FIG. 7B, gain reduction at low input power is mitigated and the gain drop at 10 dBm input power disappears.

While the exemplary preferred embodiments of the present invention are described herein with particularity, those skilled in the art will appreciate various changes, additions, and applications other than those specifically mentioned, which are within the spirit of this invention. For example, while all transistors used in the exemplary figures herein are drawn as field effect transistors, the same principles may be applied for bipolar transistors or other transistor types. Further, while this document focuses on a complete implementation of the dynamic biasing circuit on chip, parts of the biasing circuitry, namely the error amplifier or the current source can be implemented fully or partially off-chip without altering the principle idea of using a separate on-chip sense transistor in a high-bandwidth closed-loop circuitry to obtain a constant quiescent current.

What is claimed is:

1. Apparatus for stabilizing gain in a supply modulated RF circuit having an RF amplifying transistor comprising:
    a DC input for a fixed DC voltage supply to power the apparatus;
    an RF input for a time-varying RF input-voltage signal to be amplified, the RF input connected to the amplifying transistor;
    a supply input for a time-varying supply voltage signal based upon the RF input voltage signal;
    an output for providing amplified output voltage;
    a sense transistor that is analogous to the amplifying transistor, the sense transistor connected to the supply input and disposed on-chip with the amplifying transistor;
    control circuitry connected to the supply input and the sense transistor and configured to keep current of the sense transistor substantially constant by varying sense transistor bias voltage to compensate for variation in the time-varying supply voltage signal; and
    circuitry configured to supply the varying sense transistor bias voltage as bias voltage to the amplifying transistor, wherein the quiescent current of the amplifying transistor is kept substantially independent of the time-varying supply voltage.

2. The apparatus of claim 1 wherein the supply modulated RF circuit is two-stage and has a second amplifying transistor, and further comprising circuitry configured to supply the varying sense transistor bias voltage as bias voltage to the second amplifying transistor.

3. The apparatus of claim 1 wherein the control circuitry comprises a current source, and amplifier, and two resistors.

4. The apparatus of claim 3 wherein the current source is controlled externally.

5. The apparatus of claim 1 wherein the control circuitry is disposed on-chip with the amplifying transistor and the sense transistor.

6. The apparatus of claim 1 wherein the amplifying transistor and the sense transistor comprise GaN transistors.

7. The apparatus of claim 1 wherein the amplifying transistor and the sense transistor comprise GaAs transistors.

8. The apparatus of claim 1 wherein the time-varying supply voltage signal has a bandwidth greater than 1 MHz.

9. The apparatus of claim 1 wherein the time-varying supply voltage signal varies between discrete voltage levels.

10. The apparatus of claim 1 wherein the time-varying supply voltage signal is derived from an envelope signal of the time-varying RF input voltage signal.

11. The method of stabilizing gain in a supply modulated RF circuit having an amplifying transistor comprising the steps of:
    (a) disposing a sense transistor analogous to the amplifying transistor on-chip with the amplifying transistor;
    (b) powering the apparatus with a fixed DC power supply;
    (c) providing a time-varying RF input voltage signal to be amplified to the amplifying transistor;
    (c) providing a time-varying supply voltage signal based upon the time-varying RF input voltage signal to the amplifying transistor and to the sense transistor;
    (d) maintaining current in the sense transistor substantially constant by varying bias voltage on the sense transistor to compensate for variation in the time-varying supply voltage signal; and
    (e) supplying the varying sense transistor bias voltage as bias voltage to the amplifying transistor to keep the quiescent current of the amplifying transistor substantially constant.

12. The method of claim 11 wherein the supply modulated RF circuit is two-stage and has a second amplifying transistor, and further including the step of supplying the varying sense transistor bias voltage as bias voltage to the second amplifying transistor.

13. The method of claim 11 wherein the amplifying transistor and the sense transistor comprise GaN transistors.

14. The method of claim 11 wherein the amplifying transistor and the sense transistor comprise GaAs transistors.

15. The method of claim 11 wherein the supply voltage signal has a bandwidth greater than 1 MHz.

16. The method of claim 11 wherein the time-varying supply voltage signal varies between discrete voltage levels.

17. The method of claim 11 wherein the time-varying supply voltage signal is derived from an envelope signal of the time-varying RF input voltage signal.

* * * * *